United States Patent [19]

Mehrotra et al.

[11] Patent Number: 4,512,076
[45] Date of Patent: Apr. 23, 1985

[54] SEMICONDUCTOR DEVICE FABRICATION PROCESS

[75] Inventors: Deepak Mehrotra, Milpitas; Gerard J. Shaw, San Jose; Jok Y. Go, Sunnyvale; Rajni Kant, Milpitas, all of Calif.

[73] Assignee: Raytheon Company, Lexington, Mass.

[21] Appl. No.: 450,900

[22] Filed: Dec. 20, 1982

[51] Int. Cl.³ .............................................. H01L 21/86
[52] U.S. Cl. ................................... 29/578; 29/577 C; 29/590
[58] Field of Search .................... 29/577 C, 578, 589, 29/590; 357/15, 34; 427/84; 156/655, 657

[56] References Cited

U.S. PATENT DOCUMENTS

| | | | |
|---|---|---|---|
| 3,953,266 | 4/1976 | Takai | 29/578 |
| 4,175,317 | 11/1979 | Aoki et al. | 29/578 |
| 4,317,276 | 3/1982 | Heeren et al. | 29/578 |
| 4,326,330 | 4/1982 | LePage et al. | 29/578 |
| 4,376,336 | 3/1983 | Endo et al. | 29/576 B |

Primary Examiner—Brian E. Hearn
Assistant Examiner—Hunter L. Auyang
Attorney, Agent, or Firm—Richard M. Sharkansky; Joseph D. Pannone

[57] ABSTRACT

A semiconductor device fabrication process is provided wherein a first window is formed in a first silicon dioxide layer which is disposed over the surface of a silicon layer to expose a first portion of the silicon layer. A doped region is formed in the first portion of a silicon layer exposed by the first window. A second layer of silicon dioxide is deposited over the surface of the first, previously formed, silicon dioxide layer and over the first portion of the silicon layer exposed by the first window. A second window is formed through the first and second silicon dioxide layers to expose a second, different portion of the surface of the silicon layer. A layer of silicon nitride is disposed over the second layer of silicon dioxide and through the second formed window onto the portion of the silicon layer exposed by such second formed window. The surface of the structure is then masked with windows being formed in such mask over the first and second previously exposed portions of the silicon layer. An etchant is brought into contact with portions of the silicon nitride layer exposed by the windows formed in the mask to selectively remove the portions of the silicon nitride layer exposed by such windows and to thereby expose the portion of the second silicon dioxide layer disposed over the first exposed portion of the silicon layer and the second exposed portion of the silicon layer. A Schottky contact metal is deposited over the surface of the structure and onto the second exposed portion of the silicon layer to form a Schottky contact region. The portion of the second silicon dioxide layer disposed over the first exposed portion of the silicon layer is then selectively removed with a chemical etchant to expose a portion of the previously formed doped region.

3 Claims, 18 Drawing Figures

SEMICONDUCTOR DEVICE FABRICATION PROCESS

BACKGROUND OF THE INVENTION

This invention relates generally to semiconductor manufacturing processes and more particularly to semiconductor manufacturing processes suitable for use in integrated circuit fabrication.

As is known in the art, with the need for smaller, faster and in general more versitile integrated circuit performance, two trends are emerging in micro-electronic devices. One is a configurable interconnect array scheme wherein a plurality of gates are electrically interconnected through fusable links, for example, and wherein the array is customized by the purchaser by open circuiting selected ones of the fusable links to provide the desired configuration. The second technique is sometimes referred to as "customizing a master slice". In the second technique, an array of unconnected logic gates is initially fabricated and the gates in the array are then selectively interconnected during the final metallization process. This customization procedure is called personalization of configurable gate arrays.

As is also known in the art, any reduction in the number of masking steps required in the fabrication of the configurable gate array results in cost savings because of the elimination of the manufacturing step and the added electrical device yield increase that results from not introducing any additional yielded detracting effects associated with that additional processing step. Further, as the switching times of the gates are reduced, the need for the associated reduction in contact metallization penetration into the shallow junctions associated with such faster switching gates is required. Historically, metallization contact penetration into these junctions has not been a severe problem because of relatively loose design rules which may be tolerated with lower density arrays. Currently, however, the need for micro-electronic devices having shallow contacts are essential in order to achieve a well-controlled interfacial reaction with a device semiconductor material, typically silicon. Device reliability and ultimate catastrophic failure will be predominantly controlled to a large extent by the manner in which the metalization contacts are formed on the silicon. In bipolar structures, the emitter and base regions would typically be the most sensitive to the metallization contact-silicon interface reaction. The metallization contact-silicon interface is particularly critical when a Schottky contact is formed.

One technique suggested to fabricate a bipolar semiconductor device has been to first form a base diffusion in a silicon epitaxial layer formed on a semiconductor substrate. A silicon dioxide layer is then formed on the surface of the epitaxial layer. A mask process is used to form a window through a portion of the silicon dioxide layer disposed over the portion of the base diffusion region where the emitter region is to be formed. A suitable dopant is diffused through the window into the base diffusion region to form the emitter region. A second window is formed in the silicon dioxide layer over the region of the epitaxial layer where a Schottky contact metallization is to be formed. A second layer of silicon dioxide is deposited over the previously formed silicon dioxide layer and over the areas of the epitaxial layer exposed by the windows. A layer of silicon nitride is then deposited over the second silicon dioxide layer. A third layer of silicon dioxide is then deposited over the layer of silicon nitride. The process then continues by forming a window through the third silicon dioxide layer, the silicon nitride layer, and the first and second silicon dioxide layers using an oversized photoresist mask to expose the region where the Schottky contact is to be formed. A suitable metal such as platinum is deposited over the surface of the structure and through this later formed window onto the exposed portion of the epitaxial layer. The structure is then heated to form a platinum silicide Schottky contact with the remaining portion of the platinum being chemically removed. A second oversized mask having a window over the emitter contact region is then used to remove the third silicon dioxide layer, the silicon nitride layer and the first and second silicon dioxide layers to expose the emitter contact region. It should be noted that with this process prior to the formation of the platinum silicide Schottky contact, a layer of silicon dioxide is disposed on the portion of the silicon epitaxial layer where the platinum silicide Schottky contact is to be subsequently formed. Because the thermal expansion coefficient of the silicon is different from that of the silicon dioxide, crystal dislocations in the silicon region where the platinum silicide Schottky contact is to be formed causes the subsequently deposited platinum to grow in fault lines in the silicon with the result that after forming a platinum silicide contact in such region of the silicon, large reverse bias fields which lower the breakdown voltage of the Schottky contact result, and since this effect is random and not readily predictable, the performance reliability of the device is adversely affected. It should also be noted that this process requires that the etchant used to remove selected portions of a silicon nitride layer in exposing the emitter contact region also contacts the previously formed platinum silicide Schottky contact. The etchant used is hot phosphoric acid and the use of such etchant has the concommitant effect of also attacking the previously formed platinum silicide.

SUMMARY OF THE INVENTION

In accordance with the present invention, a semiconductor device fabrication process is provided wherein a first window is formed in a first silicon dioxide layer which is disposed over the surface of a silicon layer to expose a first portion of the silicon layer. A doped region is formed in the first portion of a silicon layer exposed by the first window. A second layer of silicon dioxide is deposited over the surface of the first, previously formed, silicon dioxide layer and over the first portion of the silicon layer exposed by the first window. A second window is formed through the first and second silicon dioxide layers to expose a second, different portion of the surface of the silicon layer. A layer of silicon nitride is disposed over the second layer of silicon dioxide and through the second formed window onto the portion of the silicon layer exposed by such second formed window. The surface of the structure is then masked with windows being formed in such mask over the first and second previously exposed portions of the silicon layer. An etchant is brought into contact with portions of the silicon nitride layer exposed by the windows formed in the mask to selectively remove the portions of the silicon nitride layer exposed by such windows and to thereby expose the portion of the second silicon dioxide layer disposed over the first exposed portion of the silicon layer and the second exposed portion of the silicon layer. A Schottky contact metal is deposited over the surface of the structure and onto the second exposed portion of the silicon layer to form a Schottky contact region. The portion of the second silicon dioxide layer disposed over the first exposed portion of the silicon layer is then selectively removed with a chemical etchant to expose a portion of the previously formed doped region.

With such a process, a critical masking step associated with the prior art processes described above is eliminated; the portion of the silicon layer wherein the Schottky contact region is to be formed is protected by the deposited silicon nitride layer which has a thermal expansion coefficient more closely matched to the underlying silicon than silicon dioxide thereby reducing stress induced dislocations in the Schottky semiconductor junction region associated with the prior process; and the etchant used to remove the silicon nitride layer and thereby expose the Schottky contact region is prevented from chemically attacking the diffused region because of the deposited silicon dioxide layer covering such diffused region.

BRIEF DESCRIPTION OF THE DRAWINGS

The foregoing features of this invention, as well as the invention itself, may be more fully understood from the following detailed description read together with the accompanying drawings in which.

DESCRIPTION OF THE PREFERRED EMBODIMENTS

Figure 1A:
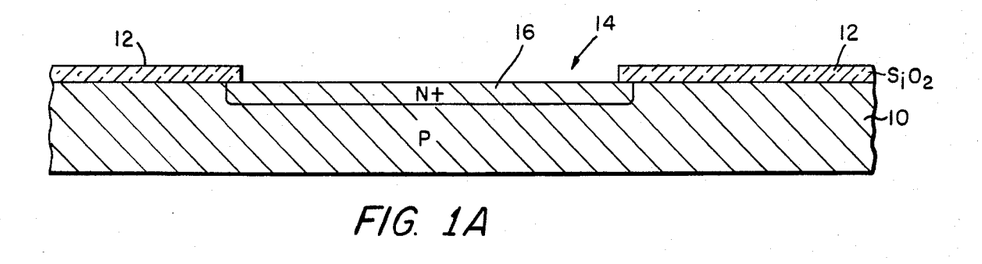
FIGS. 1A through 1J are cross-sectional elevation views of a bipolar, Schottky transistor fabricated according to the invention at various steps in the manufacture thereof.

Referring now to FIG. 1A, a substrate 10, here p-type silicon, having a surface in the <100> crystalgraphic plane and a resistivity of 10 to 40 ohm-cm is shown. A layer 12 of silicon dioxide is thermally grown over the surface of the substrate 10. Such layer 12 is masked by a photoresist layer (not shown) in a conventional manner to form an aperture 14 in a selected portion of the silicon dioxide layer 12 to expose an underlying portion of the wafer 10 wherein a subcollector region is to be formed. More particularly, after the photoresist layer is removed, a suitable n-type dopant is diffused through window 14 into the upper portion of the wafer 10 to form an N+ subcollector region 16, as shown. After the formation of the subcollector region 16, the silicon dioxide layer 12 is removed by any chemical etchant.

Figure 1B:
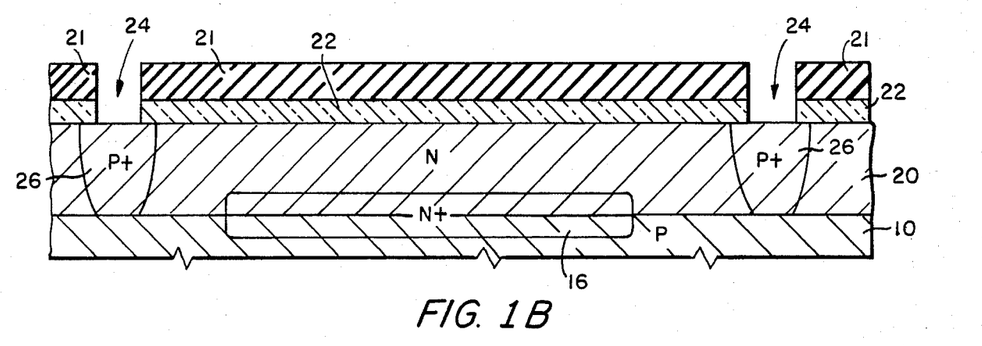

After removal of the silicon dioxide layer 12, an epitaxial layer 20 (FIG. 1B) of n-type conductivity silicon is grown over the surface of the wafer 10 in a conventional manner, it being noted that a portion of the subcollector region 16 diffuses into the lower portion of the epitaxial layer 20 in a well-known manner, as shown in FIG. 1B. Here, the thickness of the epitaxial layer 20 is 2.7 to 3.3 micrometers and here has a resistivity of 0.25 to 0.35 ohm-cm. After formation of the epitaxial layer 20, a layer 22 of silicon dioxide is thermally grown over the surface of the epitaxial layer 20, as shown in FIG. 1B. A layer of photoresist 21 is formed and patterned over the layer 22 of silicon dioxide and is suitably processed so that a pair of windows 24 is formed through selected regions of the silicon dioxide layer 22, as shown in FIG. 1B. The photoresist layer 21 is removed and isolation regions 26 are then formed in the epitaxial layer 20 by diffusing a suitable p-type dopant through the windows 24 into the exposed portions of the epitaxial layer 20 to thereby form p+-type conductivity isolation regions 26 which extend from the upper surface of the epitaxial layer 26 through such epitaxial layer 20 to the p-type conductivity substrate 10. A photoresist layer 23 is then formed over the surface of the structure and is patterned to provide a window 25 which exposes a portion of the silicon dioxide layer 22. A suitable silicon dioxide etchant is then brought into contact with the exposed portion of the silicon dioxide layer 22 to form a window 30 through such silicon dioxide layer 28, as shown in FIG. 1C.

Figure 1C:
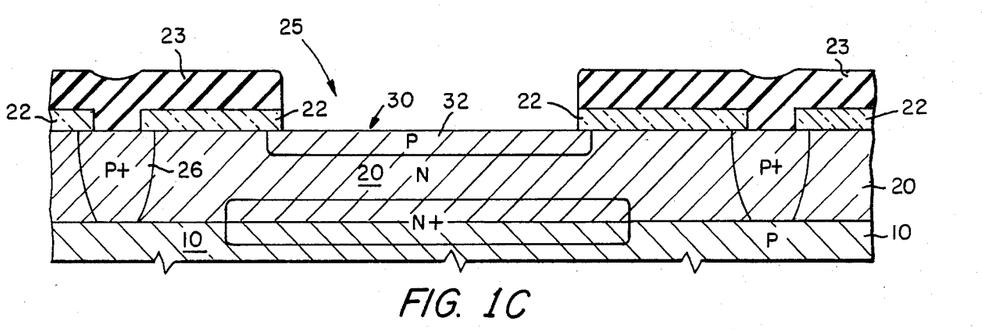
Figure 1D:
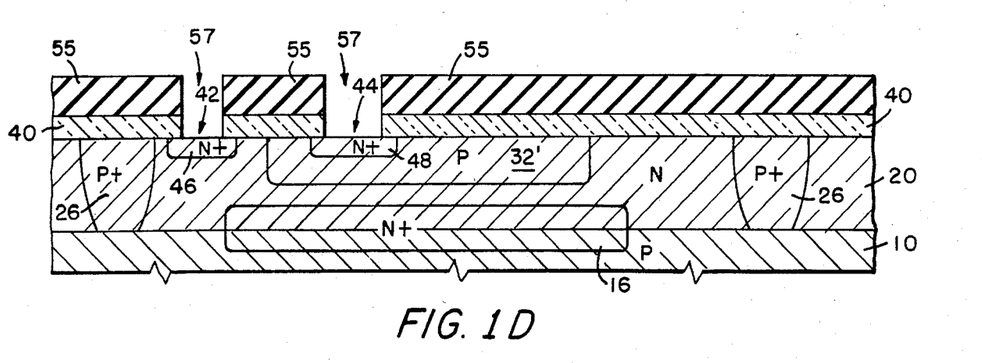

After removal of the photoresist layer 23, a suitable p-type conductivity dopant is diffused into the portion of the silicon epitaxial layer 20 exposed by the window 30 to form a predeposition base region 32, as shown in FIG. 1C. After formation of the region 32, the silicon dioxide layer 22 is chemically removed in a conventional manner. The structure is then heated to drive the dopant in the region 32 further into the epitaxial layer 20 to produce a base region 32' having a resistivity of 400 ohms per square, as shown in FIG. 1D. During this heating process, a silicon dioxide layer 40 (FIG. 1D) is formed over the surface of the epitaxial layer 20, as shown. A photoresist layer 55 is then formed on the silicon dioxide layer 40 and is suitably patterned with a pair of windows 57 so that a conventional silicon dioxide etchant, when brought into contact with the windowed photoresist layer 55, forms a pair of windows 42, 44 in the silicon dioxide layer 40 to expose portions of the surface of the silicon epitaxial layer 20. After removal of the photoresist layer 55, a suitable n-type dopant is diffused through the windows 42, 44 into the exposed portions of the epitaxial layer 20 to form n+-type regions 46, 48; region 46 providing, as will be described hereinafter, a collector contact region and region 48 forming an emitter region within the base region 32' for a bipolar Schottky-clamped transistor.

Figure 1E:
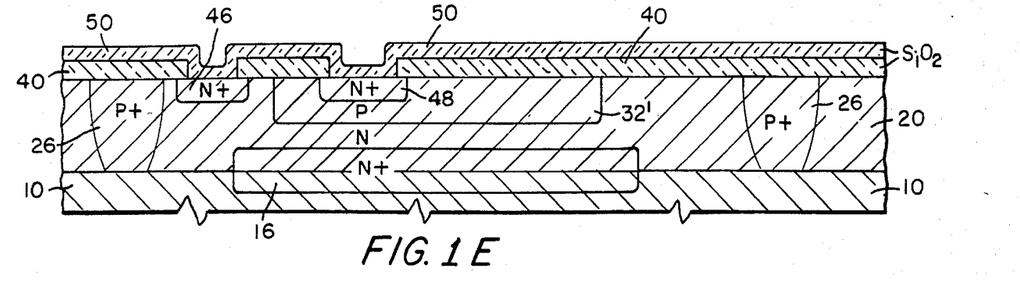
Figure 1F:
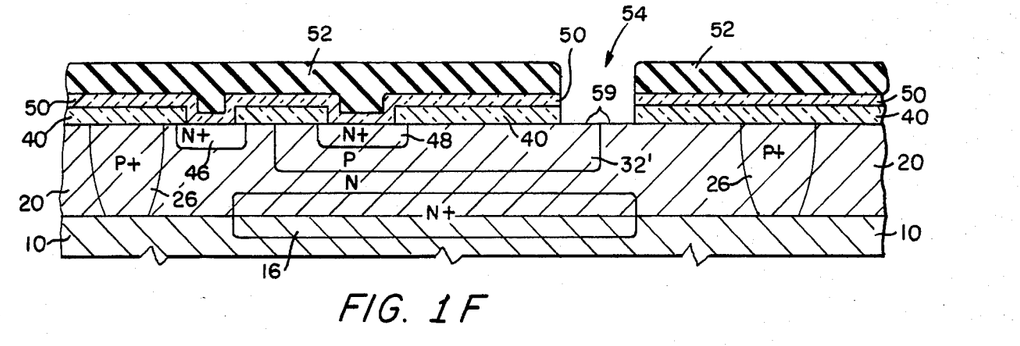

Referring now to FIG. 1E, a layer 50 of silicon dioxide, here 500 angstroms in thickness, is deposited over the silicon dioxide layer 40, and exposed portions of the silicon epitaxial layer 20 (over the collector contact region 46 and emitter region 48, as shown) using a conventional low pressure chemical vapor deposition process. As shown in FIG. 1F, a layer 52 of photoresist is deposited over layer 50 and a window 54 is formed therein using conventional photolithographic-chemical etching techniques. A suitable silicon dioxide etchant is then brought into contact with the portions of the silicon dioxide layers 40, 50 exposed by window 54 to expose an underlying portion of the surface of the silicon epitaxial layer 20. It is noted that the junction between the p-type conductivity base region 32' and the n-type conductivity epitaxial layer 20 extends to the portion 59 of the surface of the epitaxial layer 20 exposed by the removed portions of the silicon dioxide layers 40, 50, as shown in FIG. 1F.

The photoresist layer 52 shown in FIG. 1F is then removed in a conventional manner. A layer 56 (FIG. 1G) of silicon nitride is then formed over the surface of silicon dioxide layer 50 and over the portion 59 of the surface of the epitaxial layer 20 exposed by the removal of the silicon dioxide layers 40, 50. Here, a low pressure chemical vapor deposition process is used to form the silicon nitride layer 56 and here such layer 56 is formed with a thickness of 1500 angstroms. Next, a layer 58 of silicon dioxide is formed over the silicon nitride layer 56, here using a low pressure chemical vapor deposition process, with such silicon dioxide layer 58 being formed with a thickness of 700 angstroms.

Figure 1G:
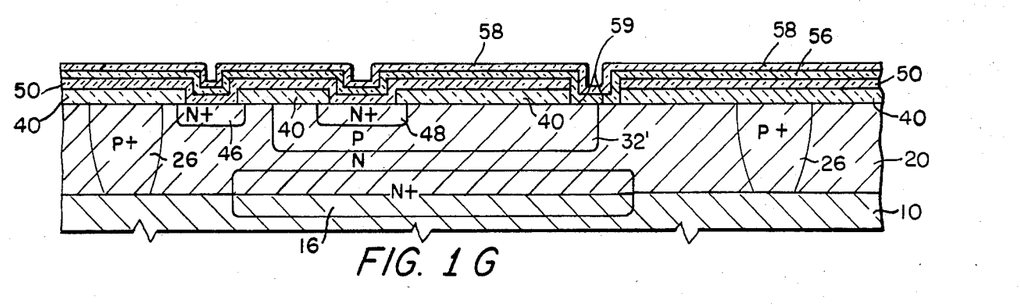
Figure 1H:
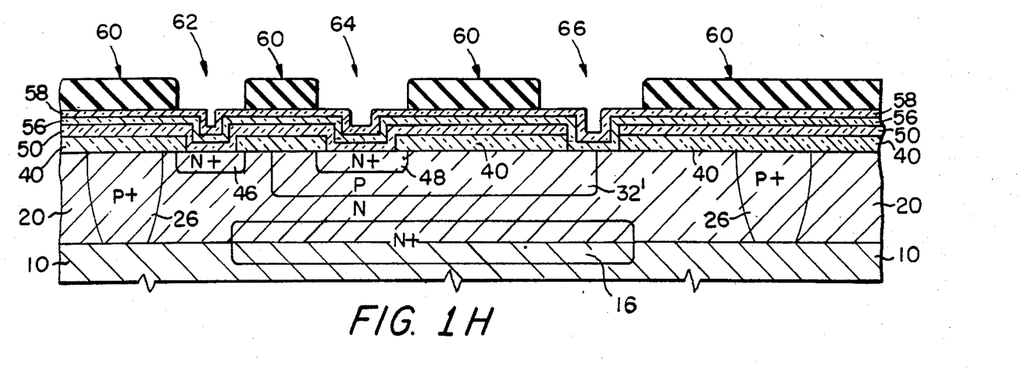
Figure 1I:
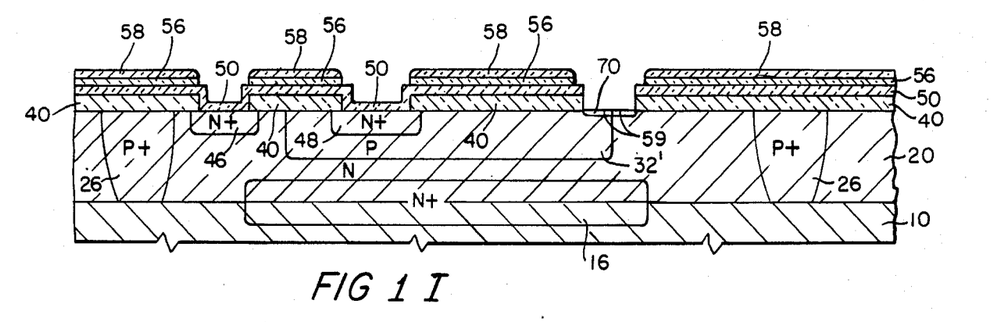

Referring now to FIG. 1H, a layer 60 of photoresist is then deposited over the surface of silicon dioxide layer 58. The photoresist layer 60 is then patterned to have formed therein windows 62, 64, 66, as shown. A suitable silicon dioxide etchant is then brought into contact with the exposed portions of silicon dioxide layer 58 to remove such exposed portions of the silicon dioxide layer 58. The photoresist layer 60 is then removed. The etched silicon dioxide layer 58 is then used as an etchresistant mask and a suitable silicon nitride etchant, here hot phosphoric acid, is brought into contact with the portions of the silicon nitride layer 56 exposed by the removed portions of silicon dioxide layer 58, as shown in FIG. 1I. It is noted that the hot phosphoric acid etching process is inhibited by silicon dioxide layer 50, thereby preventing etching of the silicon dioxide disposed over collector contact and emitter regions 46 and 48. It is noted, however, that the hot phosphoric acid removes the portion of the silicon nitride layer 56 disposed over the portion 59 of the epitaxial layer 20, thus exposing such portion 59 of epitaxial layer 20, as shown in FIG. 1I. A layer of metal, here platinum (not shown) is deposited over the surface of the structure and thus over silicon dioxide layers 50, 58, and also over the portion 59 of the silicon epitaxial layer 20. The structure is then heated so that the deposited platinum reacts with the silicon in the surface portion 59 of epitaxial layer 20 to form a Schottky contact layer 70 of platinum silicide. It is noted that layer 70 extends laterally into both the base diffusion region 32' and the silicon epitaxial layer 20, as shown in FIG. 1I. The unreacted platinum layer is then removed with aqua regia in a conventional manner.

The portion of the second silicon dioxide layer 50 disposed over the first exposed portion of the silicon layer 20 is then selectively removed with a chemical etchant to expose a portion of the previously formed doped region 46.

Figure 1J:
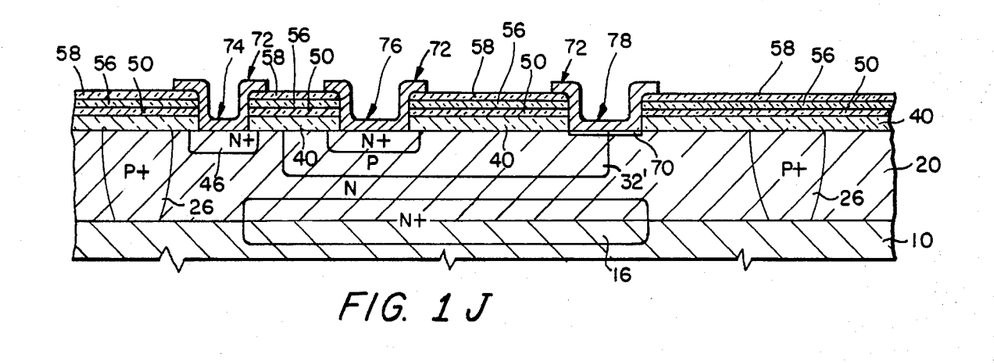
Figure 1K:
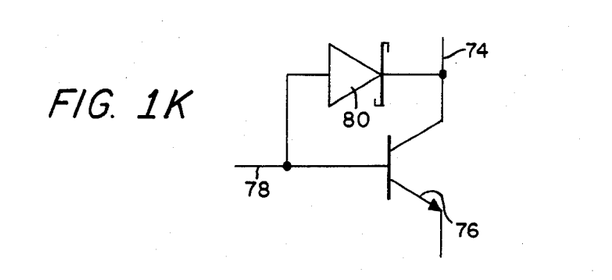
FIG. 1K is a schematic diagram of the Schottky transistor manufactured according to the steps shown in FIGS. 1A through 1J.

Referring now to FIG. 1J, a suitable contact metal 72 is then deposited over the surface of the structure. The contact metal layer 72 is then patterned into a collector contact electrode 74, an emitter electrode contact 76 and a base electrode contact 78, as shown in FIG. 1J. As noted above, the platinum silicide region 70 provides a Schottky contact between the base region 32' and the silicon epitaxial layer 20, thus forming a Schottky-clamped bipolar transistor shown schematically in FIG. 1K with the platinum silicide region 70 together with base contact electrode 78 providing a Schottky diode 80 between the base electrode 78 and the collector electrode 74, as shown in FIG. 1K.

Figure 2A:
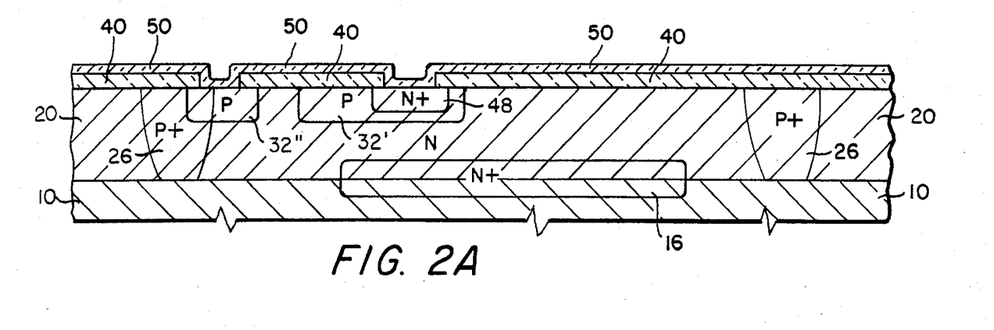
FIGS. 2A through 2F are cross-sectional elevation views of an integrated Schottky logic (ISL) gate fabricated according to the invention at various steps in the manufacture thereof.
Figure 2B:
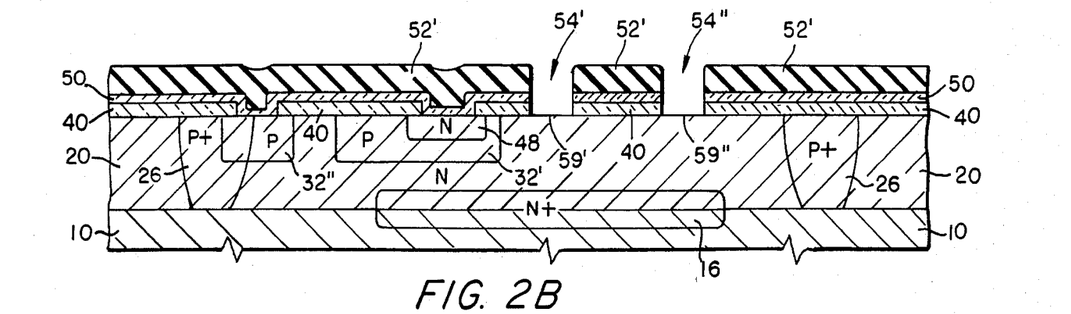
Figure 2C:
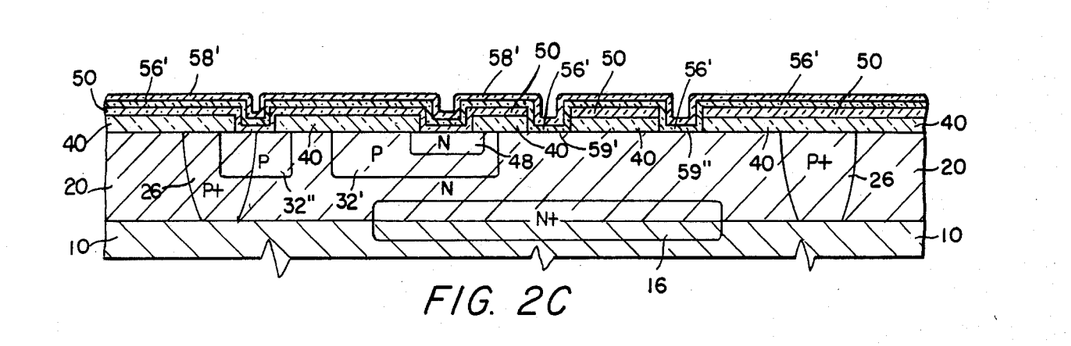
Figure 2D:
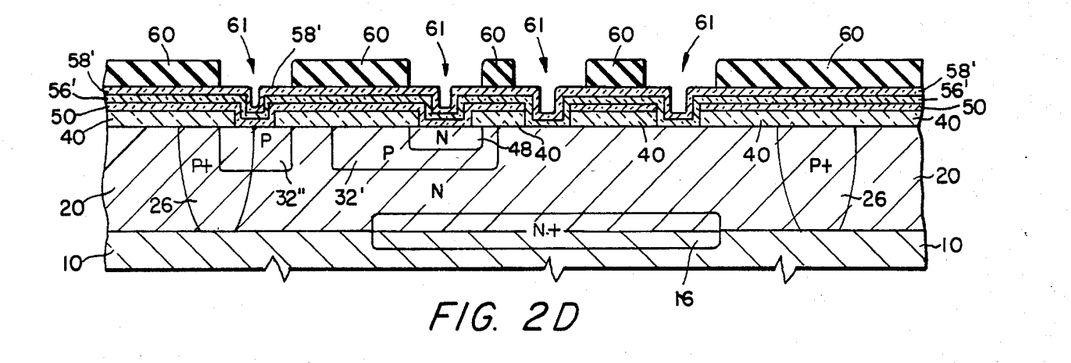
Figure 2E:
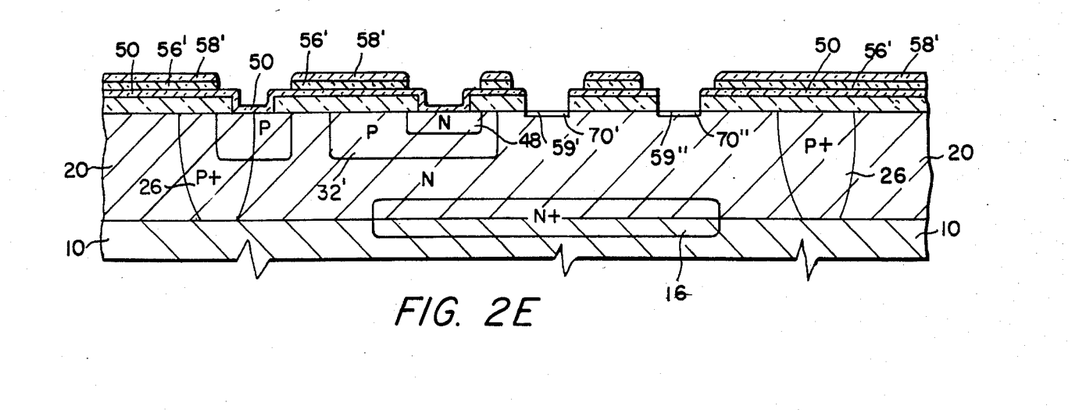
Figure 2F:
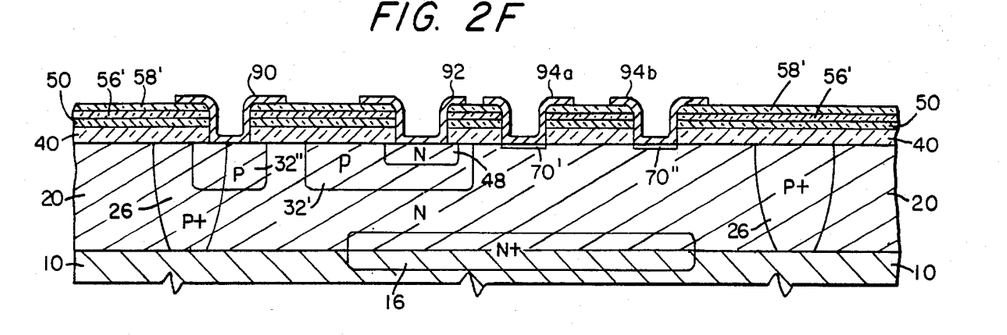
Figure 2G:
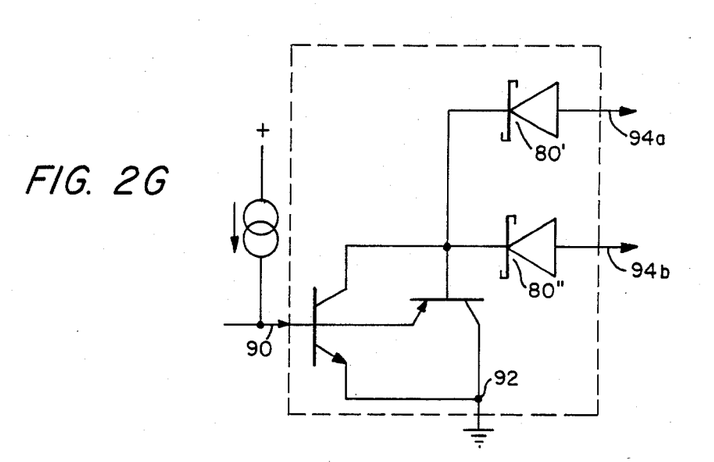
FIG. 2G is a schematic diagram of the integrated Schottky logic gate manufactured according to the steps shown in FIGS. 2A through 2F.

Referring now to FIGS. 2A through 2F, fabrication of an Integrated Schottky Logic gate shown schematically in FIG. 2G and described in an article entitled "ISL, A Fast and Dense Low-Power Logic, Made in a Standard Schottky Processes" by Jan Lohstroh and published in the *IEEE Journal of Solid State Circuits*, Vol. SC-14, No. 3, June 1979, Pages 585 through 590, here fabricated according to the invention, will be described. As shown in FIG. 1B, an epitaxial layer 20 formed on a silicon substrate 10 with a buried subcollector region 16 and isolation regions 26 are formed as described above in connection with FIGS. 1A and 1B. Here, however, in addition to p-type diffusion region 32', a second p-diffusion region 32" is fabricated simultaneously with each other in a manner similar to that described above in connection with FIGS. 1C and 1D. It is noted that p-diffusion region 32" extends into both the isolation region 26 and into the epitaxial layer 20, as discussed in the article referred to above. The n-type conductivity emitter region 48 is diffused into the base diffusion region 32', as described in connection with FIG. 1D. Thus, after formation of the emitter region 48, a layer of silicon dioxide 50 is disposed on the layer of silicon dioxide layer 40, as described in connection with FIG. 1E above, to produce the structure shown in FIG. 2A.

Having formed the structure as shown in FIG. 2A, a layer of photoresist 52' (FIG. 2B) is applied to the surface of silicon dioxide layer 50 and has a pair of windows 54', 54" formed therein to expose underlying portions of layer 50. A suitable silicon dioxide etchant is brought into contact with the portions of the silicon dioxide layer 50 exposed by windows 54", 54" to chemically etch away the exposed portions of layer 50 and the subsequently exposed portions of silicon dioxide layer 40 to subsequently remove such exposed portions of the silicon dioxide layers 40, 50 and thereby expose surface portions 59', 59" of epitaxial layer 20. A layer 56' of silicon nitride is then chemically vapor deposited with a low pressure process over the surface of silicon dioxide layer 50 and over the exposed portions 59', 59" of the surface of epitaxial layer 20. A layer 58' of silicon dioxide is then chemically vapor deposited with a low pressure process over silicon nitride layer 56', as shown in FIG. 2C.

Referring now to FIG. 2D, a photoresist layer 60 is deposited over the surface of the structure shown in FIG. 2C, such photoresist layer 60 being patterned as shown with windows 61, as shown in FIG. 2D. A suitable silicon dioxide etchant is brought into contact with the portions of the silicon dioxide layer 58' exposed by the windows 61 to remove such exposed portions of the silicon dioxide layer 58'. The photoresist layer 60 is then removed and then, using the patterned silicon dioxide layer 58' as a mask, a suitable silicon nitride chemical etchant, here hot phosphoric acid, is brought into contact with the portions of the silicon nitride layer 56' exposed by the patterned silicon dioxide layer 58 to remove such exposed portions of the silicon nitride layer 56', as shown in FIG. 2E. It is noted that portions of the silicon dioxide layer 50 over the p-diffusion regions 32', 32" and over the emitter region 48 protect the silicon surfaces of such regions 32", 48 from the hot phosphoric acid. It is also noted, however, that the hot phosphoric acid in removing the silicon nitride layer 56' exposes the portions 59', 59" of the silicon epitaxial layer 20, as shown in FIG. 2E. A layer of a suitable metal, here platinum, is deposited over the surface of the structure. It is noted that portions of the platinum layer (not shown) contact portions 59', 59" of the epitaxial layer 20. When the structure is heated, the platinum in contact with portions 59', 59" of the silicon epitaxial layer 20 form platinum silicide regions 70', 70", as shown in FIG. 2E. The remaining portions of the platinum are removed using a suitable solution, here aqua regia. As is known, such solution will remove the platinum layer but will leave the platinum silicide regions 70', 70"

Referring now to FIG. 2F, base emitter and output electrodes 90, 92, 94A, 94B are provided an any conventional manner to provide the ISL gate shown in FIG. 2G. It is noted that the base contact electrode 90 provides the input to the ISL gate and that the emitter contact 92 is adapted for coupling to ground, as shown in FIG. 2G. The Schottky platinum silicide regions 70', 70" provide together with output electrodes 94A, 94B a pair of Schottky diodes 80', 80", the anodes thereof being coupled to output electrodes 94A, 94B, as shown.

It is noted that during the processing of the semiconductor device for the fabrication of the bipolar Schottky transistor shown in FIG. 1K and described in connection with FIGS. 1A through 1J and during the fabrication of the ISL gate shown in FIG. 2G and described in connection with FIGS. 2A through 2F: silicon nitride layers 56, 56', as shown in FIGS. 1G and 2C, respectively, are deposited on the portions of the silicon epitaxial layer where the Schottky contact regions are to be formed thereby reducing thermal expansion coefficient mismatches in the Schottky area to thus decrease the generation of strain-induced dislocations in the metal-epitaxial junction; and during the removal of the portions of the silicon nitride layers 56, 56' to expose the Schottky contact regions as shown in FIGS. 1H to 1I and FIGS. 2D to 2E, the emitter region 48 is protected from the silicon nitride chemical etchant by portions of silicon dioxide layer 50 thereby avoiding the personalization etchant from contacting with the Schottky contact metallization.

Having described preferred embodiments of the invention, it will now be apparent to one of skill in the art that other embodiments incorporating these concepts may be used. It is believed, therefore, that this invention should not be restricted to the disclosed embodiments but rather should be limited only by the spirit and scope of the appended claims.

What is claimed is:

1. The method of forming a semiconductor structure comprising the steps of:

(a) forming a first window in a first silicon dioxide layer disposed over the surface of a silicon semiconductor layer to expose a first portion of the silicon layer;
   (b) forming a doped region in the first portion of the silicon layer exposed by the first window;
   (c) disposing a second layer of silicon dioxide over the surface of the first previously formed silicon dioxide layer and over the first portion of the silicon layer exposed by the first window;
   (d) forming a second window through the first and second silicon dioxide layers to expose a second, different portion of the surface of the silicon layer;
   (e) disposing a layer of silicon nitride over the second layer of silicon dioxide and through the second formed window onto the portion of the silicon layer exposed by such second formed window;
   (f) forming a mask over the silicon nitride layer with windows disposed over the first and second previously exposed portions of the silicon layer;
   (g) bringing an etchant into contact with portions of the silicon nitride layer exposed by the windows formed in the mask to selectively remove said portions of the silicon nitride layer exposed by such windows to expose the portion of the second silicon dioxide layer disposed over the first exposed portion of the silicon layer and to expose the second exposed portion of the silicon layer;
   (h) forming a Schottky contact with the second exposed portion of the silicon layer; and,
   (i) selectively removing the portion of the second silicon dioxide layer disposed over the first portion of the silicon layer to expose a portion of the previously formed doped region.

2. The method recited in claim 1 wherein forming the Schottky contact comprises the steps of:
   (a) disposing a metal over the surface of the etched silicon nitride layer and onto the second exposed portion of the silicon layer; and,
   (b) processing the structure to form the Schottky contact.

3. The method as recited in claim 2 including the step of:
   forming an electrode in contact with the doped region.

* * * * *

UNITED STATES PATENT OFFICE
CERTIFICATE OF CORRECTION

Patent No. 4,512,076    Dated April 23, 1985

Inventor(s) Deepak Mehrotra et al

It is certified that error appears in the above-identified patent and that said Letters Patent are hereby corrected as shown below:

Column 1, Line 11:  Change "versitile" to --versatile--;

Column 1, Line 46:  Change "metalization" to --metallization--;

Column 3, Line 48:  Change "crystalgraphic" to --crystallographic--;

Column 6, Line 29:  Change "54''" (first occurrence) to --54'--; and

Column 7, Line 8:   Change "an" to --in--.

*Signed and Sealed this*

*Thirty-first* Day of *December 1985*

[SEAL]

Attest:

Attesting Officer

DONALD J. QUIGG

Commissioner of Patents and Trademarks